United States Patent
Suzuki et al.

(10) Patent No.: US 8,729,648 B2
(45) Date of Patent: May 20, 2014

(54) MAGNETIC BODY DEVICE AND MANUFACTURING METHOD THEREOF

(71) Applicant: Renesas Electronics Corporation, Kanagawa (JP)

(72) Inventors: Tetsuhiro Suzuki, Kanagawa (JP); Katsumi Suemitsu, Kanagawa (JP); Eiji Kariyada, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/863,409

(22) Filed: Apr. 16, 2013

(65) Prior Publication Data

US 2013/0285176 A1     Oct. 31, 2013

(30) Foreign Application Priority Data

Apr. 27, 2012  (JP) .................................. 2012-103288

(51) Int. Cl.
*H01L 29/82*     (2006.01)

(52) U.S. Cl.
USPC ................... 257/421; 257/E27.006; 438/3

(58) Field of Classification Search
USPC .................. 257/421, E27.006; 438/3
See application file for complete search history.

(56) References Cited

U.S. PATENT DOCUMENTS

2012/0299133 A1 *  11/2012  Son et al. .................... 257/421
2013/0248355 A1 *  9/2013   Ohsawa et al. ......... 204/192.34
2014/0010004 A1 *  1/2014   Suzuki ....................... 365/158

FOREIGN PATENT DOCUMENTS

JP          2009-239135          10/2009

OTHER PUBLICATIONS

Miron et al., "Current-drivespin torque induced by the Rashba effect in a ferromagnetic metal layer", Nature Materials, vol. 9, p. 230, 2010.
Miron et al., "Perpendicularswitching of a single ferromagnetic layer induced by in plane currentinjection", Nature, vol. 476. 189, 2011.

* cited by examiner

Primary Examiner — Trung Q Dang
(74) Attorney, Agent, or Firm — Young & Thompson

(57) ABSTRACT

A magnetic body device has a stacked structure comprising an underlying layer, a magnetic body layer, and a cap layer. The material for the underlying layer is different from that for the cap layer. The magnetic body layer has a free magnetization region having perpendicular magnetic anisotropy and a first characteristic change region and a second characteristic change region situated on both sides of the free magnetization region in a first in-plane direction. The perpendicular magnetic anisotropy of the first characteristic change region and the second characteristic change region is at a level lower than that of the free magnetization region. An external magnetic field containing a component in the first in-plane direction is applied to the free magnetization region. Further, a current in the first in-plane direction is supplied to the free magnetization region.

12 Claims, 12 Drawing Sheets

MAGNETIC BODY DEVICE AND MANUFACTURING METHOD THEREOF

CROSS-REFERENCE TO RELATED SPECIFICATIONS

The disclosure of Japanese Patent Application No. 2012-103288 filed on Apr. 27, 2012 including the specification, drawings, and abstract is incorporated herein by reference in its entirety.

BACKGROUND

The present invention concerns a magnetic body device and a manufacturing method thereof.

A magnetic memory, particularly, a magnetic random access memory (MRAM) is prospective as a non-volatile memory capable of high speed operation and infinite times of rewriting and has been developed vigorously in recent years. MRAM uses a magnetic body as a memory device and stores data corresponding to the direction of magnetization of the magnetic body. For writing data into the magnetic memory, it is necessary to change the direction of magnetization in the magnetic body.

While various methods have been known as a switching method of magnetization direction of the magnetic body, a method of utilizing spin-orbit coupling has been proposed in recent years (for example, refer to Japanese Unexamined Patent Publication No. 2009-239135 (Patent document 1), Miron et al., "Current-driven spin torque induced by the Rashba effect in a ferromagnetic metal layer", Nature Materials, Vol. 9, p230, 2010, (hereinafter referred to as Non-patent document 1), and Miron et al., "Perpendicular switching of a single ferromagnetic layer induced by in-plane current injection", Nature, Vol. 476, 189, 2011 (hereinafter referred to as Non-patent document 2). A magnetization switching method utilizing the spin-orbit coupling is to be described.

In FIG. 1, a magnetic body layer 120 is formed over an underlying layer 110, and a cap layer 130 is formed over the magnetic body layer 120. That is, the underlying layer 110, the magnetic body layer 120, and the cap layer 130 are stacked in this order. The stacking direction is a Z-direction and in-plane directions perpendicular to the Z-direction are an X-direction and a Y-direction. The X-direction and the Y-direction are perpendicular to each other.

The magnetic body layer 120 has perpendicular magnetic anisotropy. In FIG. 1, the direction of magnetization M in the magnetic body layer 120 is +Z-direction. Further, the magnetic body layer 120 is in contact at the lower surface with the underlying layer 110 and in contact at the upper surface with the cap layer 130. Materials for the underlying layer 110 and the cap layer 130 are different. In the example described in the Non-patent document 2, a stacked structure of the underlying layer 110/magnetic body layer 120/cap layer 130 is Pt/Co/AlO. Accordingly, characteristics of the interface between the magnetic body layer 120 and the underlying layer 110 are different from the characteristics of the interface between the magnetic body 120 and the cap layer 130. In other words, the magnetic body layer 120 has vertically "asymmetric" interfaces.

It is assumed that a current Iw in an in-plane direction (for example, in +X-direction) is supplied to the magnetic body layer 120. In this case, "Rashba effective magnetic field $H_R$" is produced due to the spin-orbit coupling. The direction of the Rashba effective magnetic field $H_R$ is the direction of a cross product of the "asymmetric" direction (+Z-direction) and the direction of the in-plane current Iw (+X-direction), and this is +Y-direction in the example of FIG. 1.

Further, when an external magnetic field H is applied to the magnetic body layer 120 as illustrated in FIG. 2, the external magnetic field H and the Rashba effective magnetic field $H_R$ produce an effective magnetic field $H_E$. The direction of the effective magnetic field $H_E$ is the direction of a cross product of the direction of the Rashba effective magnetic field $H_R$ and the direction of the external magnetic field H. As illustrated in FIG. 2, when the direction of the external magnetic field H is the +X-direction, an effective magnetic field $H_E$ in the −Z-direction is produced.

The magnetization M of the magnetic body layer 120 can be reversed to the −Z-direction by acting the thus produced effective magnetic field $H_E$ in the −Z-direction. Conversely, when the direction of the current Iw is set to the −X-direction, an effective magnetic field $H_E$ in the +Z-direction is produced. Magnetization M of the magnetic body layer 120 can be reversed to the +Z-direction by acting the effective magnetic field $H_E$ in the +Z-direction. That is, magnetization of the magnetic body layer 120 can be switched by switching the direction of the in-plane current Iw supplied to the magnetic body layer 120.

FIG. 3 is a schematic view illustrating a configuration of a device described in the Non-patent document 2. The stacked structure of the underlying layer 110/magnetic body layer 120/cap layer 130 is Pt/Co/AlO. The magnetic body layer 120 is formed over a portion of the underlying layer 110, and the current Iw is supplied to the magnetic body layer 120 by way of the underlying layer 110. Specifically, the current Iw is caused to flow between both ends of the underlying layer 110 and a portion of the current Iw is supplied to the magnetic body layer 120.

SUMMARY

In the configuration illustrated in FIG. 3, a current necessary for switching magnetization of the magnetic body layer 120 increases by so much as the current that flows in the underlying layer 110. For suppressing shunt to the underlying layer 110, it may be considered to reduce the thickness of the underlying layer 110 or increase the specific resistivity of the underlying layer 110. However, increase in the resistance of the underlying layer 110 gives rise to a problem, for example, of heat generation, electromigration, and increase in the voltage.

Other subjects and novel features will become apparent by reading the description of the present specification in conjunction with the appended drawings.

According to one aspect of the invention, a magnetic body device has a laminated structure of an underlying layer, a magnetic body layer, and a cap layer. Materials for the underlying layer and the cap layer are different. The magnetic body layer has a free magnetization region having perpendicular magnetic anisotropy and a first characteristic change region and a second characteristic change region situated on both sides of the free magnetization region in a first in-plane direction. Perpendicular anisotropy of the first characteristic change region and the second characteristic change region is lower than that of the free magnetization region. An external magnetic field containing a component in the first in-plane direction is applied to the free magnetization region. Further, a current in the first in-plane direction is supplied to the free magnetization region.

According to another aspect of the invention, a method of manufacturing a magnetic body device includes a step of forming a stacked structure of an underlying layer, a magnetic body layer, and a cap layer. The magnetic body layer has perpendicular magnetic anisotropy. Materials for the underlying layer and the cap layer are different. The underlying layer has a first underlying region and a second underlying region coupled respectively to a pair of current terminals spaced apart in the first in-plane direction respectively. The magnetic body layer has a first region in contact with the first underlying region, a second region in contact with the second underlying region and a third region put between the first region and the second region. The manufacturing method further includes a step of making the perpendicular magnetic anisotropy of the first region and the second region to a level lower that of the third region.

A current necessary for switching the magnetization of the magnetic body layer is decreased according to the invention.

DETAILED DESCRIPTION

A magnetic body device according to an embodiment of the invention and a method of manufacturing the same are to be described with reference to the appended drawings.

1. Basic Configuration

Figure 1:
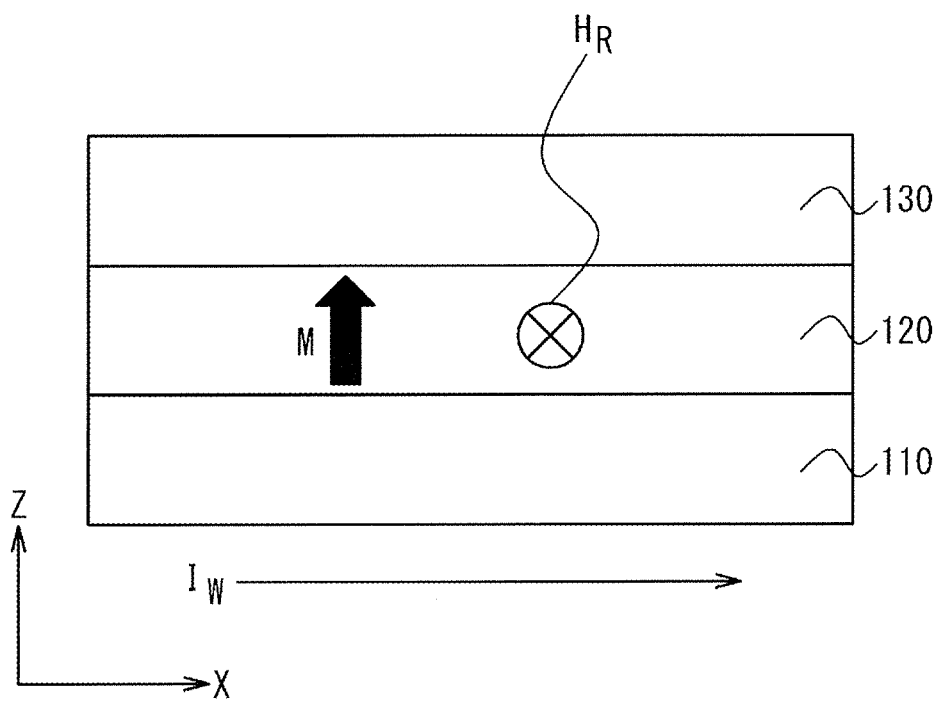
FIG. 1 is a conceptional view for explaining a magnetization switching method utilizing spin-orbit coupling.
Figure 2:
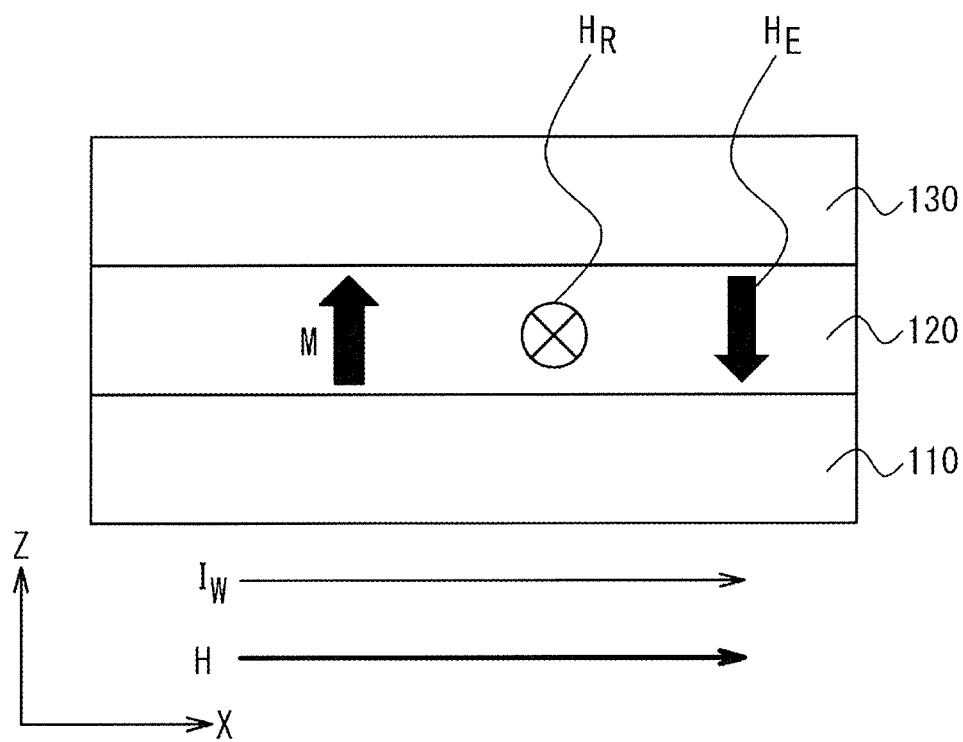
FIG. 2 is a conceptional view for explaining a magnetization switching method utilizing spin-orbit coupling.
Figure 3:
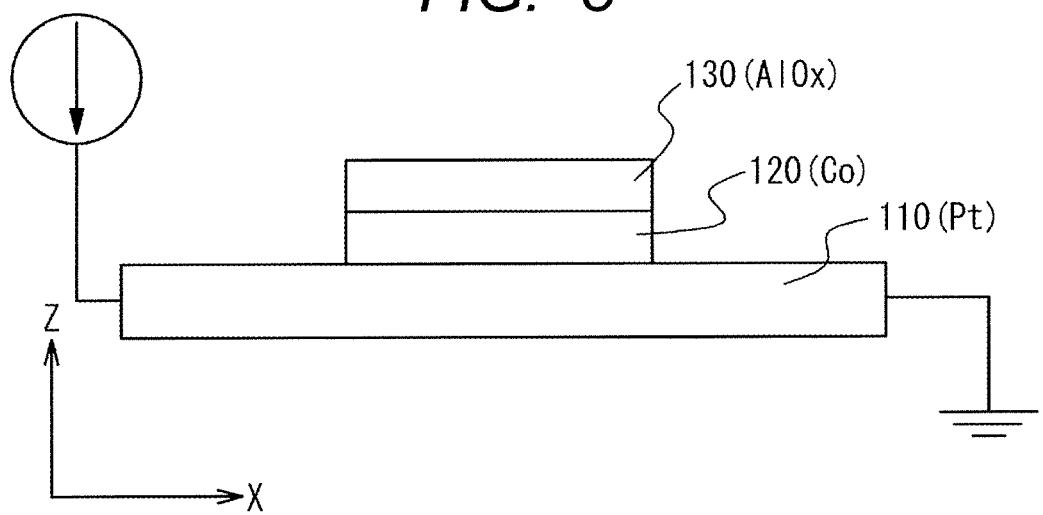
FIG. 3 is a schematic view illustrating a configuration of a device described in the Non-patent document 2.
Figure 4:
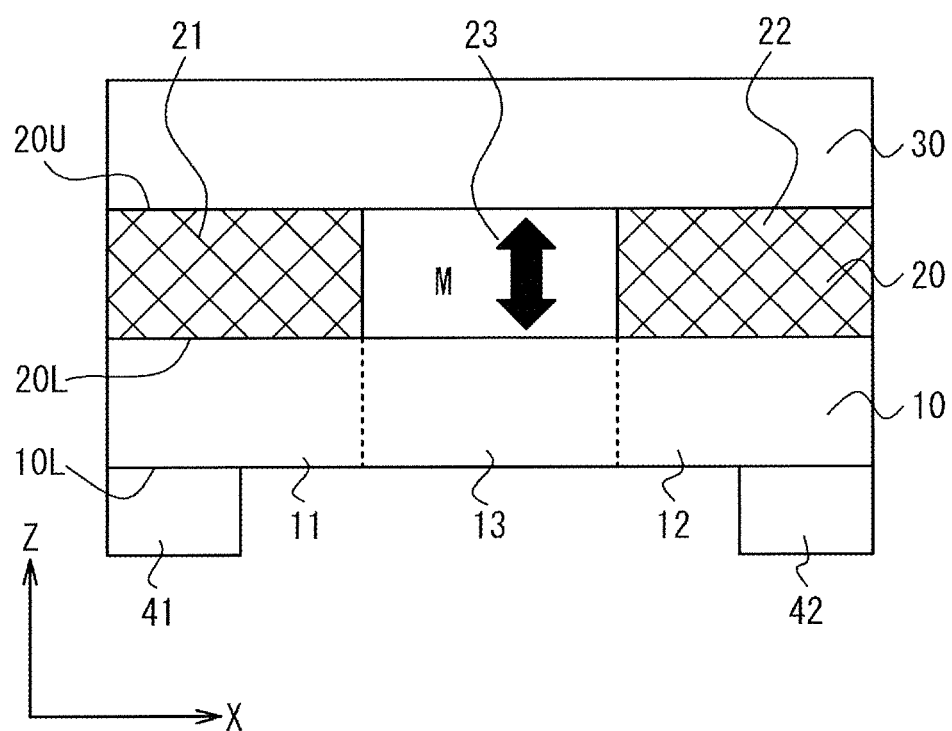
FIG. 4 is a schematic view illustrating a basic configuration of the magnetic body device according to an embodiment.

FIG. 4 is a schematic view illustrating a basic configuration of a magnetic body device according to the embodiment. The magnetic body device has an underlying layer 10, a magnetic body layer 20, and a cap layer 30. The magnetic body layer 20 is formed over the underlying layer 10, and the cap layer 30 is formed over the magnetic body layer 20. That is, the underlying layer 10, the magnetic body layer 20, and the cap layer 30 are stacked in this order. The stacking direction is a Z-direction, and an in-plane direction perpendicular to the Z-direction is an X-direction and a Y-direction. The X-direction and the Y-direction are perpendicular to each other.

The underlying layer 10 is formed of a conductive material (for example, Pt and Ta). The magnetic body layer 20 is formed of a magnetic material (for example: Co or CoFeB). The cap layer 30 is formed of an oxide, for example, AlO and MgO.

A magnetic body layer 20 is in contact at a lower surface 20L with the underlying layer 10 and in contact at the upper surface 20U with the cap layer 30. In this embodiment, materials for the underlying layer 10 and the cap layer 30 are different. The stacked structure of underlying layer 10/magnetic body layer 20/cap layer 30 is, for example, Ta/CoFeB/MgO. Accordingly, the characteristics of the interface between the magnetic body layer 20 and the underlying layer 10 is different from the characteristic of the interface between the magnetic body layer 20 and the cap layer 30. In other words, the magnetic body layer 20 has vertically "asymmetric" interfaces.

Figure 5:
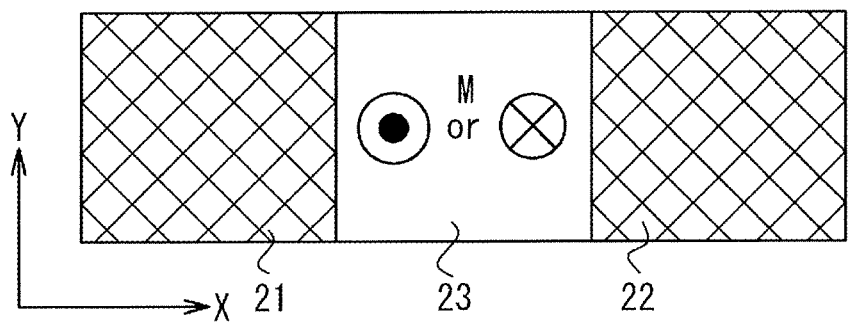
FIG. 5 is a plan view illustrating a configuration of a magnetic body layer of the magnetic body device according to the embodiment.

FIG. 5 is a plan view illustrating a configuration of the magnetic body layer 20 in the embodiment. As illustrated in FIG. 4 and FIG. 5, the magnetic body layer 20 has a first characteristic change region 21, a second characteristic change region 22, and a free magnetization region 23. The first characteristic change region 21 and the second characteristic change region 22 are situated adjacent to both sides of the free magnetization region 23 in an X-direction. In other words, the free magnetization region 23 is put between the first characteristic change region 21 and the second characteristic change region 22 in the X-direction. The free magnetization region 23 may also be surrounded at the periphery by the characteristic change regions. Also in this case, the free magnetization region 23 is put between the first characteristic change region 21 and the second characteristic change region 22 described above in the X-direction.

The free magnetization region 23 has perpendicular magnetic anisotropy. That is, the free magnetization region 23 shows magnetic characteristics as a perpendicular magnetization film and the magnetization M has a component in a perpendicular direction (Z-direction) as a main component. Direction of magnetization M in the free magnetization region 23 is not fixed but can be reversed.

The first characteristic change region 21 and the second characteristic change region 22 have magnetic characteristics different from those of the free magnetization region 23. Specifically, perpendicular magnetic anisotropy of the first characteristic change region 21 and the second characteristic change region 22 is lower than the perpendicular magnetic anisotropy of the free magnetization region 23. For example, the first characteristic change region 21 and the second characteristic change region 22 show magnetic characteristics as an in-plane magnetization film and magnetization thereof has a component in the in-plane direction as a main component. Alternatively, magnetization may be eliminated in the first characteristic change region 21 and the second characteristic change region 22 when taking notice on the portion that functions as the vertical magnetization film. In any case, the configuration of the magnetic body layer 20 according to this embodiment is equivalent with a case where the free magnetization region 23 is patterned when taking notice on the portion that functions as the vertical magnetization film.

Referring to FIG. 4 again, the underlying layer 10 can be divided into a first underlying layer region 11, a second underlying layer region 12, and a third underlying layer region 13 corresponding respectively to the regions 21, 22, and 23 of the magnetic body layer 20. More specifically, the first underlying region 11 is in contact with the lower surface 20L of the first characteristic change region 21. The second underlying region 12 is in contact with the lower surface 20L of the second characteristic change region 22. The third underlying region 13 is in contact with the lower surface 20L of the free magnetization region 23.

Further, the magnetic body device according to this embodiment has a first lower electrode 41 and a second lower electrode 42. The first lower electrode 41 and the second lower electrode 42 are disposed below the underlying layer 10 being spaced apart from each other in the X-direction. More specifically, the first lower electrode 41 is coupled to the first underlying region 11 of the underlying layer 10. On the other hand, the second lower electrode 42 is coupled to the second underlying region 12 of the underlying layer 10. In the example illustrated in FIG. 4, the first lower electrode 41 is in contact with the lower surface 10L of the first underlying layer 11, and the second lower electrode 42 is in contact with the lower surface 10L of the second underlying region 12.

The first lower electrode 41 and the second lower electrode 42 serve as "a pair of current terminals" for supplying an in-plane current Iw to the underlying layer 10 and the magnetic body layer 20. That is, since the pair of current terminals 41 and 42 are provided being spaced apart from each other in the X-direction, the in-plane current Iw in the X-direction is obtained by flowing a current therebetween. Particularly, since the pair of current terminals 41 and 42 are coupled to the first underlying region 11 and the second underlying region 12 respectively, and the free magnetization region 23 is situated between the first underlying region 11 and the second underlying layer 12, the in-plane current Iw in the X-direction flows at least in the free magnetization region 23.

Figure 6:
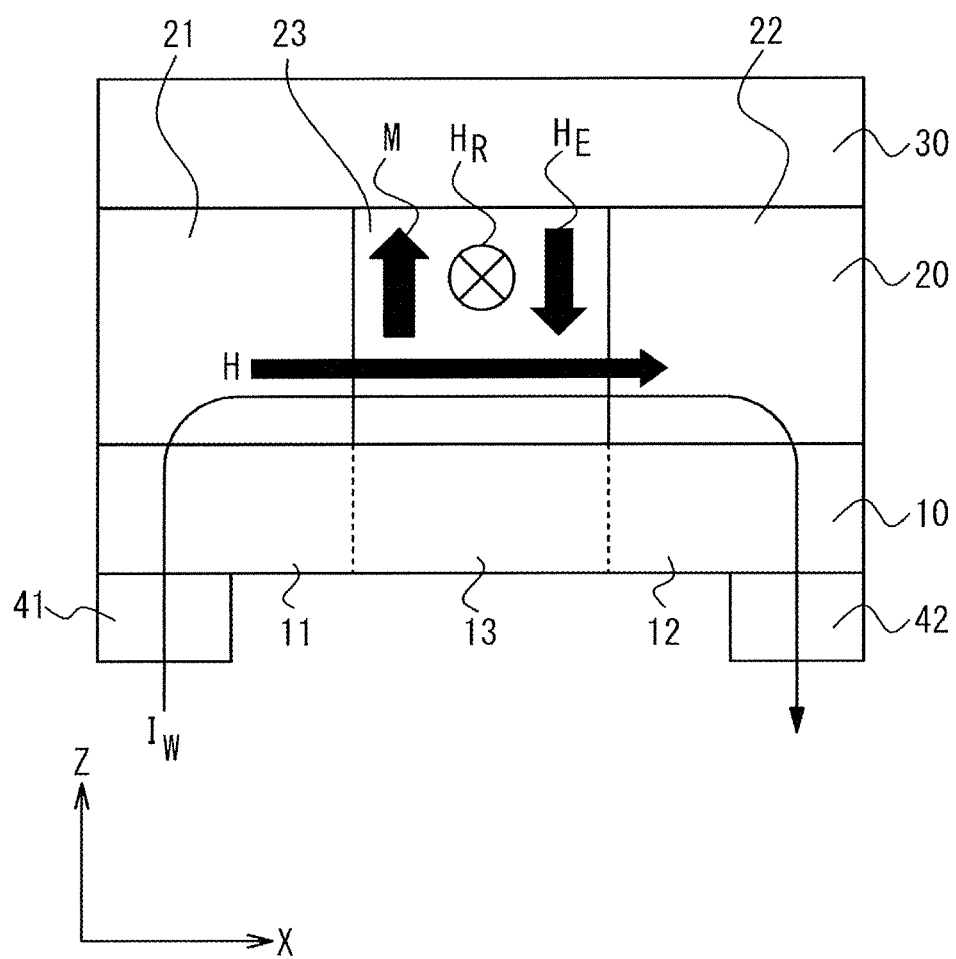
FIG. 6 is a conceptional view explaining magnetization switching in the magnetic body device according to the embodiment.

Referring to FIG. 6, a magnetization switching method to the magnetic body layer 20 (free magnetization region 23) in this embodiment is to be described. As an example, it is assumed a state where the direction of the magnetization N of the free magnetization region 23 is in the +Z-direction. Further, it is assumed that an external magnetic field H including a component in the +X-direction is applied at least to the free magnetization region 23.

By using the pair of current terminals (41, 42), a current Iw from the first lower electrode 41 to the second lower electrode 42 (write current) is supplied. Thus, the in-plane current Iw in the +X-direction flows at least to the free magnetization region 23 as described above.

It should be noted that the current Iw is shunted between the first underlying region 11 and the first characteristic change region 21 since the first underlying region 11 coupled to the first lower electrode 41 is in contact with the first characteristic change region 21. That is, a state where the first underlying region 11 is in charge of the entire current Iw is avoided. In the same manner, since the current Iw is shunted between the second underlying region 12 and the second characteristic change region 22, a state where the second underlying region 12 is in charge of the entire current Iw is avoided.

When the in-plane current Iw in the +X-direction is supplied to the free magnetization region 23, a Rashba effective magnetic field $H_R$ is produced due to spin-orbit coupling. The direction of the Rashba effective magnetic field $H_R$ is the direction of the cross product of the "asymmetric direction of the interface (+Z-direction) and the direction of the in-plane current Iw (+X-direction) and this is in the +Y-direction in the example of FIG. 6. Further, an effective magnetic field is produced by the external magnetic field H and the Rashba effective magnetic field $H_R$. The direction of the effective magnetic field $H_E$ is a direction of a cross product between the direction of the Rashba effective magnetic field $H_R$ (+Y-direction) and the direction of the external magnetic field H (+X-direction) and this is the −Z-direction in the example of FIG. 6.

Magnetization M of the free magnetization region 23 can be reversed to the −Z-direction by acting the effective magnetic field in the −Z-direction produced as described above. Conversely, when the direction of the current Iw is set in the −X-direction, an effective magnetic field $H_E$ in the +Z-direction is produced. Magnetization M of the free magnetization region 23 can be reversed to the +Z-direction by acting such effective magnetic field H in the +Z-direction, That is, magnetization can be switched for the free magnetization region 23 by switching the direction of the current Iw supplied between the pair of current terminals (41, 42).

According to the embodiment, a stacked structure of the underlying layer 10 and the magnetic body layer 20 is provided over the entire current path between the pair of current terminals (41, 42). That is, current is shunted between the underlying layer 10 and the magnetic body layer 20 over the entire current path. Thus, since a portion that is in charge of the entire current Iw only by the underlying 10 is not present, if the resistance of the underlying layer 10 is increased, this does not cause a problem, for example, of heat generation, electro migration, and increase in the voltage. Rather, the ratio of the current flowing in the underlying layer 10 is decreased by increasing the resistance of the underlying layer 10. This means that the current Iw can be supplied efficiently to the free magnetization region 23. As a result, the total amount of the current Iw necessary for magnetization switching of the free magnetization region 23 can be decreased preferably.

For increasing the resistance of the underlying layer 10, it may be considered to reduce the thickness of the underlying layer 10 or increasing the specific resistivity of the underlying layer 10. For example, it is preferred that the thickness of the underlying layer 10 is less than the thickness of the magnetic body layer 20. This can decrease the ratio of the current flowing in the underlying layer 10 without increasing the resistance as the entire device. As a result, the total amount of the current Iw necessary for switching the magnetization of the free magnetization region 23 can be decreased.

The magnetic body device according to this embodiment is applicable, for example, to a magnetic random access memory (MRAM), a micro computer having a (MRAM) mounted as a hybridized memory, etc.

2. External Magnetic Field Application Means

Various examples may be considered as "external magnetic field application means" for applying an external magnetic field H containing a component in the +X-direction to the free magnetization region 23 of the magnetic body layer 20.

Figure 7:
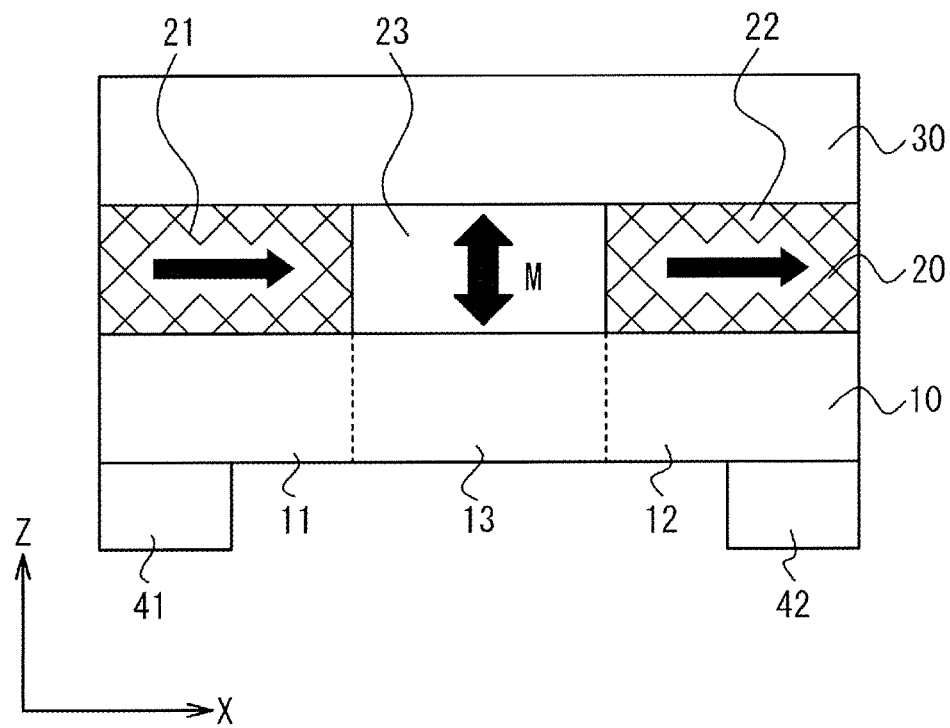
FIG. 7 is a schematic view illustrating an example of a configuration of a magnetic body device according to the embodiment.

In the example illustrated in FIG. 7, the first characteristic change region 21 and the second characteristic change region 22 show magnetic characteristics as the in-plane magnetization film and the magnetization thereof has a component in the in-plane direction as a main component. More specifically, both of the first characteristic change region 21 and the second characteristic change region 22 have the magnetization component in the +X-direction. Thus, an external magnetic field H containing the component in the +X-direction is applied to the free magnetization region 23. That is, the first characteristic change region 21 and the second characteristic change region 22 function as "external magnetic field application means".

Figure 8:
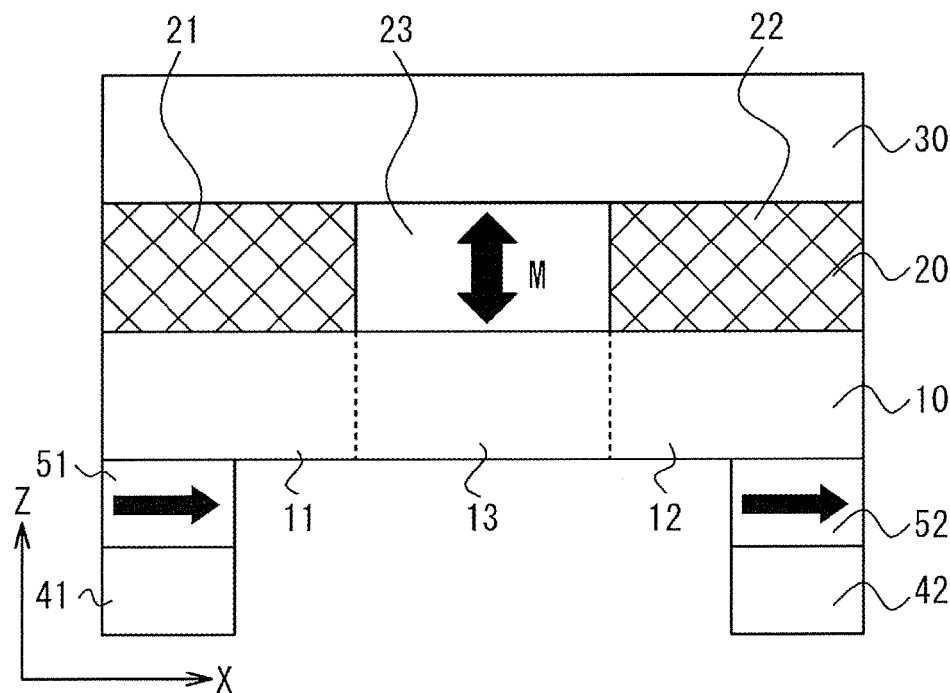
FIG. 8 is a schematic view illustrating another example of a configuration of the magnetic body device according to the embodiment.
Figure 9:
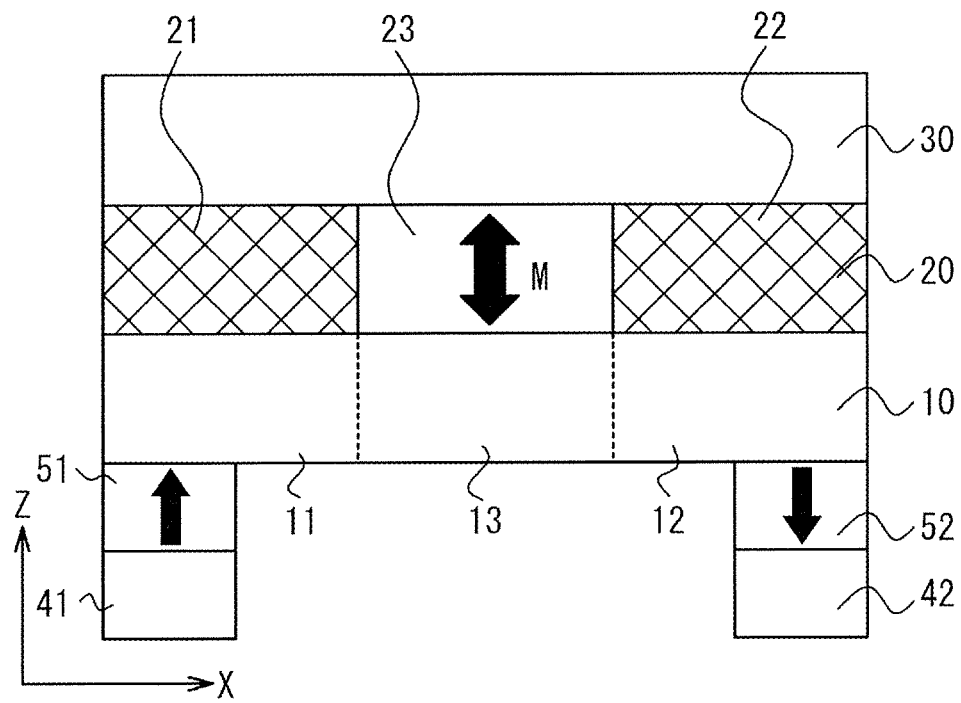
FIG. 9 is a schematic view illustrating a further example of the configuration of the magnetic body device according to the embodiment.

In the example shown in FIG. 8 and FIG. 9, a first magnetization hard layer 51 and a second magnetization hard layer 52 are provided as "external magnetic field application means". The first magnetization hard layer 51 is disposed below a first underlying region 11 of an underlying layer 10. For example, the first magnetization hard layer 51 is formed so as to be put between a first lower electrode 41 and an underlying region 11 (in this case, the first lower electrode 41 and the first magnetization hard layer 51 form one of the pair of current terminals described above). In the same manner, the second magnetization hard layer 52 is provided below a second underlying region 12 of the underlying layer 10. For example, the second magnetization hard layer 52 is formed so as to be put between the second lower electrode 42 and the second underlying region 12 (in this case, the second lower electrode 42 and the second magnetization hard layer 52 form the other of the pair of current terminals).

The magnetization direction of the first magnetization hard layer 51 is pinned. The pinned magnetization of the first magnetization hard layer 51 is hereinafter referred to as "first pinned magnetization". In the same manner, the magnetization direction of the second magnetization hard layer 52 is pinned. The pinned magnetization of the second magnetization hard layer 52 is hereinafter referred to as "second pinned magnetization". By the first pinned magnetization and the second pinned magnetization, an external magnetic field H including a component in the +X-direction is applied to the free magnetization region 23. On the contrary, respective directions of the first pinned magnetization and the second pinned magnetization are set so as to apply such external magnetic field H to the free magnetization region 23.

In the case of the example illustrated in FIG. 8, both of the first pinned magnetization and the second pinned magnetization include the same component in the +X-direction as the external magnetic field H. Thus, an external magnetic field H containing the component in the +X-direction is applied to the free magnetization region 23. In this example, an in-plane magnetization film is used for each of the magnetization hard layers (51, 52). Such in-plane magnetization film includes a CoCrPt film, NiFe film, NiFeCo film, and CoFe film, or a stacked film comprising them and an anti-ferromagnetic layer (NiMn, PtMn, etc.).

In the case of an example illustrated in FIG. 9, the first pinned magnetization and the second pinned magnetization contain components in the perpendicular direction anti-parallel to each other. Specifically, the first pinned magnetization contains a component in the +Z-direction and the second pinned magnetization contains a component in the −Z-direction which is contrary thereto. Thus, an external magnetic field H containing the component in the +X-direction is applied to the free magnetization region 23. In this example, a perpendicular magnetic film is used for each of the magnetization hard layers (51, 52). Such magnetization film includes a Co/Pt stacked film, a Co/Ni stacked film, or a stacked film comprising the same and an anti-ferromagnetic layer.

Figure 10:
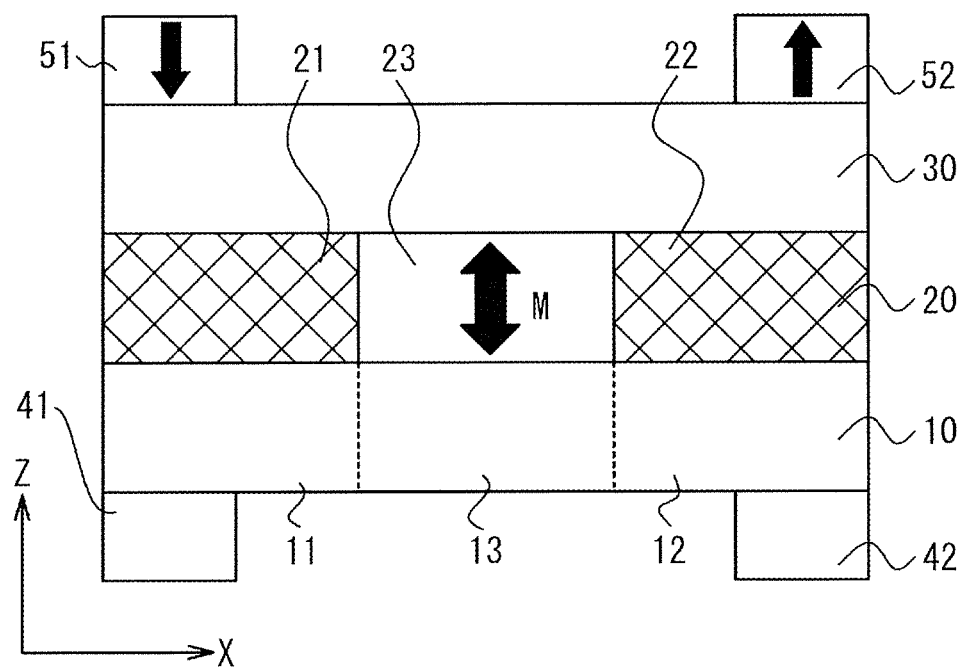
FIG. 10 is a schematic view illustrating a still further example of the configuration of the magnetic body device according to the embodiment.

In the example shown in FIG. 10, a first magnetization hard layer 51 is provided above the first characteristic change region 21, and the second magnetization hard layer 52 is provided above the second characteristic change region 22. More specifically, both of the first magnetization hard layer 51 and the second magnetization hard layer 52 are formed over the cap layer 30. The first pinned magnetization and the second pinned magnetization are identical with those in the case of the example illustrated in FIG. 8 or FIG. 9. Also in this embodiment, an external magnetic field H containing the component in the +X-direction can be applied to the free magnetization region 23. However, when a reference layer 60 is formed over the cap layer 30 as will be described later, it is necessary to ensure a space (margin) to some extent between the reference layer 60 and each of the magnetization hard layers (51, 52). In the case of the configuration in FIG. 8 and FIG. 9 described above, since there is not necessary to consider such a margin, size can be easily reduced preferably.

Figure 11:
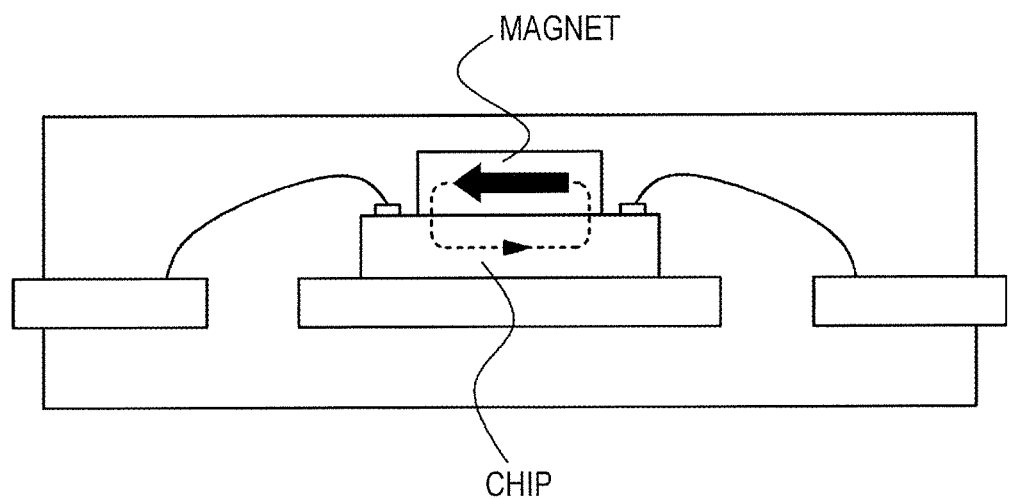
FIG. 11 is a schematic view illustrating a still further example of the configuration of the magnetic body device according to the embodiment.

In the example illustrated in FIG. 11, an external magnetic field H is applied not on every cell but over the entire chip. Therefore, a permanent magnet is disposed adjacent to the chip. Alternatively, the permanent magnet may also be provided not in adjacent with the chip but in adjacent with a package.

In the examples shown in FIG. 8 to FIG. 11, magnetization may also be eliminated in the first characteristic change region 21 and the second characteristic change region 22.

3. MTJ Device and Magnetic Memory

Figure 12:
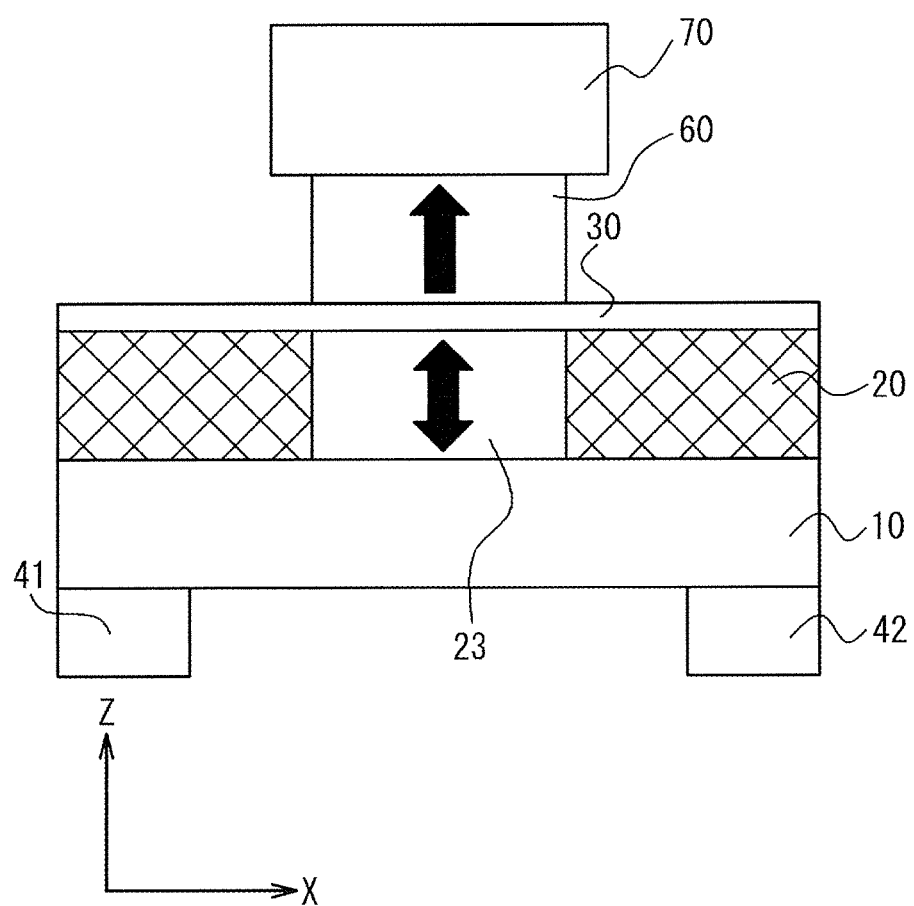
FIG. 12 is a schematic view illustrating a configuration of an MTJ device utilizing the magnetic body device according to the embodiment.

Then, it is to be considered that the magnetic body device according to the embodiment is utilized as an MTJ (Magnetic Tunnel Junction) device. FIG. 12 illustrates a configuration of an MTJ device utilizing the magnetic body device according to the embodiment. As illustrated in FIG. 12, the MTJ device further comprises a reference layer 60 and an upper electrode 70 in addition to the constitutional elements described above. The external magnetic field application means is not illustrated.

The reference layer 60 is formed over a cap layer 30 at a position opposing a free magnetization region 23. That is, the reference layer 60 is coupled by way of the cap layer 30 to the free magnetization region 23 of a magnetic body layer 20. The reference layer 60 is a perpendicular magnetization film having perpendicular magnetic anisotropy and the magnetization direction thereof is pinned in one direction (for example, +Z-direction). For example, the reference layer 60 has a stacked ferri-structure in which a stacked Co/Pt film having perpendicular magnetic anisotropy and a non-magnetic metal film such as a Ru film are stacked.

The free magnetization region 23, the cap layer 30, and the reference layer 60 form a magnetic tunnel junction (MTJ). The cap layer 30 is formed of an oxide film, for example, an AlO film or an MgO film and serves as a tunnel barrier layer of MTJ. The resistance value of MTJ varies depending on the relative relation between the magnetization direction of the free magnetization region 23 and the magnetization direction of the reference layer 60. Specifically, the resistance value of MTJ is relatively low when magnetization directions thereof are in parallel, whereas the resistance value of MTJ is relatively high when magnetization directions thereof are in anti-parallel. Such magnitude of the resistance value corresponds to "0" and "1" of data.

Upon reading data, a read current is caused to flow between the upper electrode 70 coupled to the reference layer 60 and the first lower electrode 41 or the second lower electrode 42. Magnitude relation of the resistance value of MTJ, that is, data stored in the MTJ device can be judged based on the read current or read voltage.

Data writing corresponds to reversal of the magnetization direction in the free magnetization region 23 of the magnetic body 20. That is, the current Iw supplied between a pair of current terminals (41, 42) corresponds to a write current. Necessary data can be written into the MTJ device by switching the direction of the write current Iw. It can be said that the magnetic body layer 20 having the free magnetization region 23 serves as a data recording layer.

Figure 13:
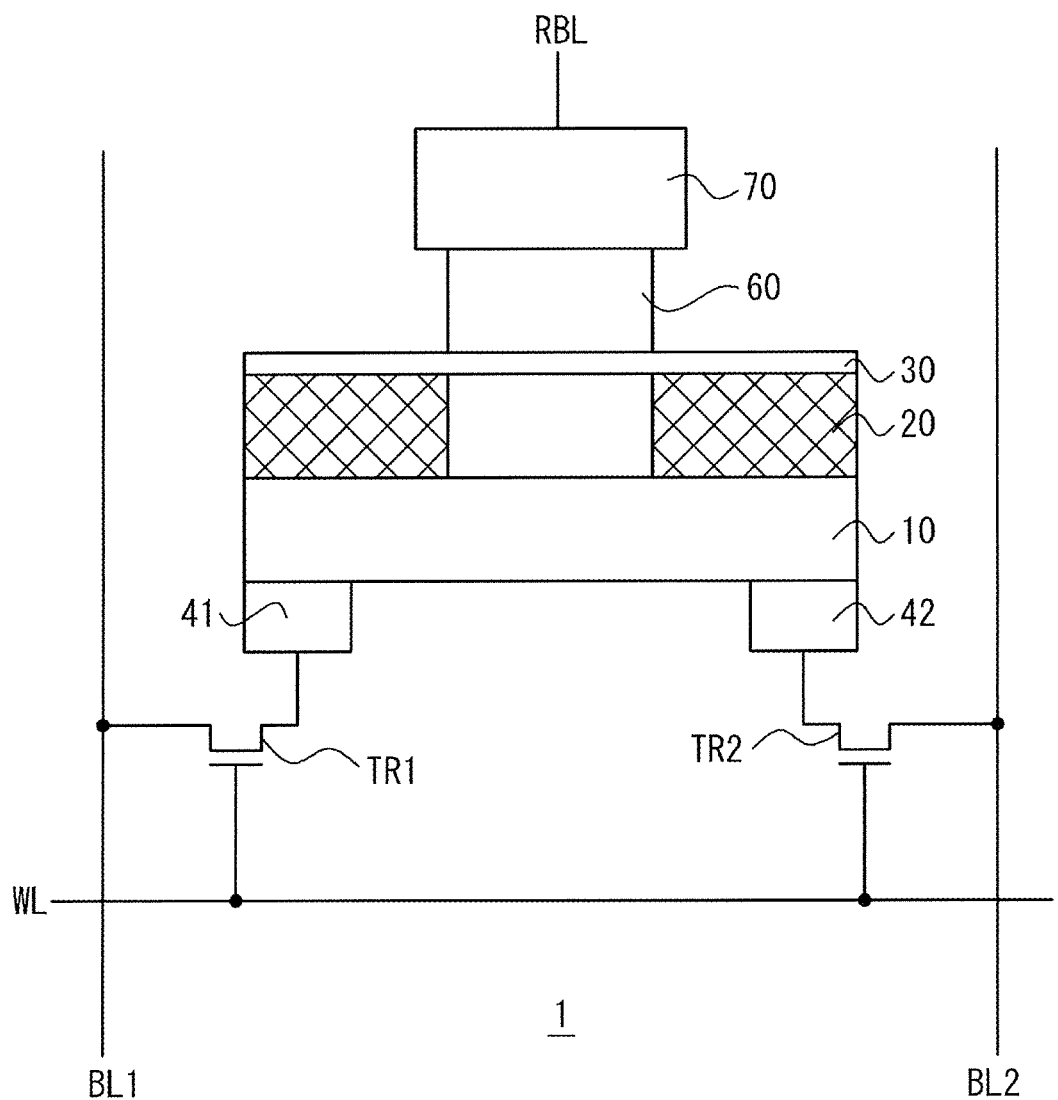
FIG. 13 illustrates a configurational example of a memory cell utilizing the MTJ device illustrated in FIG. 12.

FIG. 13 illustrates a configurational example of a memory cell 1 that utilizes the MTJ device illustrated in FIG. 12. A first lower electrode 41 is coupled by way of a first selection transistor TR1 to a first bit line BL1. A second lower electrode 42 is coupled by way of a second selection transistor TR2 to a second bit line BL2. Both of gate electrodes of the first selection transistor TR1 and the second selection transistor TR2 are coupled to the word line WL. An upper electrode 70 is coupled to a read bit line RBL.

When a selection voltage is applied to the word line WL, the first selection transistor TR1 and the second selection transistor TR2 are turned ON. Then, by appropriately setting the state of voltage for each of the first bit line BL1, the second bit line BL2, and the read bit line RBL respectively, the read current or the write current Iw can be supplied to the memory cell 1.

Figure 14:
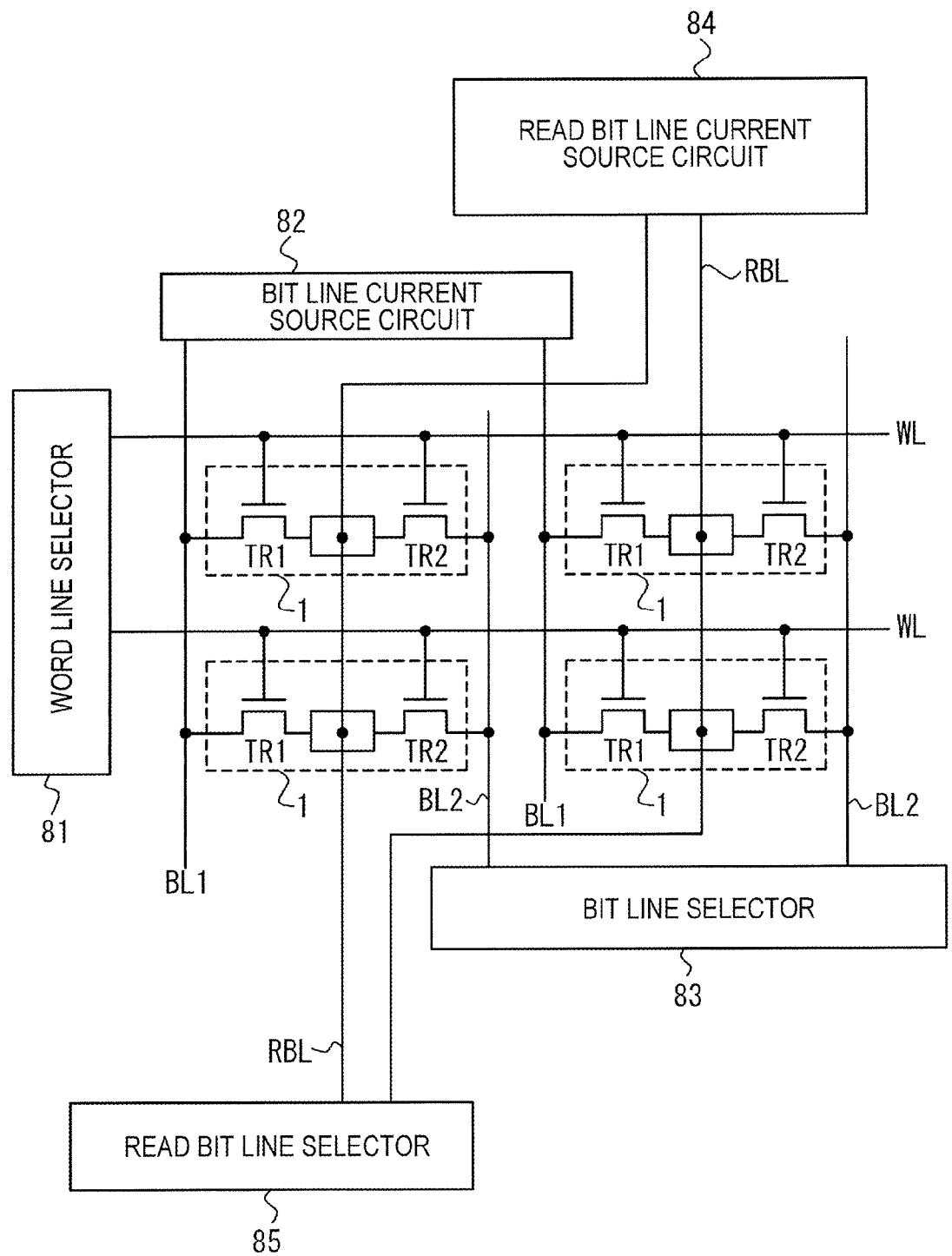
FIG. 14 illustrates a configurational example of a magnetic memory utilizing the memory cell illustrated in FIG. 13.

FIG. 14 illustrates a configurational example of a magnetic memory that utilizes the memory cell 1 illustrated in FIG. 13. The magnetic memory has a memory cell array, a word line selector 81, a bit line current source circuit 82, a bit line selector 83, a read bit line current source circuit 84, and a read bit line selector 85. The memory cell array comprises a plurality of memory cells 1 arranged in an array.

The word line selector 81 is coupled to the word lines WL and drives a designated word line WL. The bit line current source circuit 82 is coupled to the first bit line BL1 and supplies a write current Iw to the first bit line BL1. The bit line selector 83 is coupled to the second bit line BL2 and selects a designated second bit line BL2. The read bit line current source circuit 84 is coupled to the read bit line RBL and supplies a read current to the bit line RBL. The read bit line selector 85 is coupled to the read bit lines RBL and selects a designated read bit line RBL. With such a configuration, the read current or write current Iw can be supplied to a desired memory cell 1.

4. Manufacturing Process

FIG. 15A to FIG. 15L are cross sectional views for explaining an example of a manufacturing process of the magnetic body device according to the embodiment. In this case, description is to be made to a case having the first magnetization hard layer 51 and the second magnetization hard layer 52 as illustrated in FIG. 8 described above. The first magnetization hard layer 51 and the second magnetization hard layer 52 correspond to a pair of current terminals.

Figure 15A:
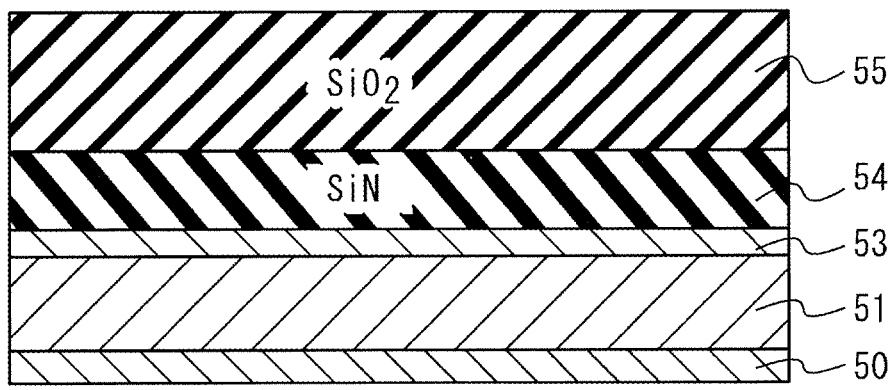
FIG. 15A is a cross sectional view for explaining a manufacturing process of a magnetic body device according to an embodiment.

As illustrated in FIG. 15A, an underlying layer 50, a first magnetization hard layer 51, a cap layer 53, a hard mask layer (SiN) 54, and a hard mask layer ($SiO_2$) 55 are deposited successively.

The hard mask layer 55, the hard mask layer 54, and the cap layer 53 are etched by using a predetermined resist mask. As a result, a hard mask is formed as illustrated in FIG. 15B.

Figure 15B:
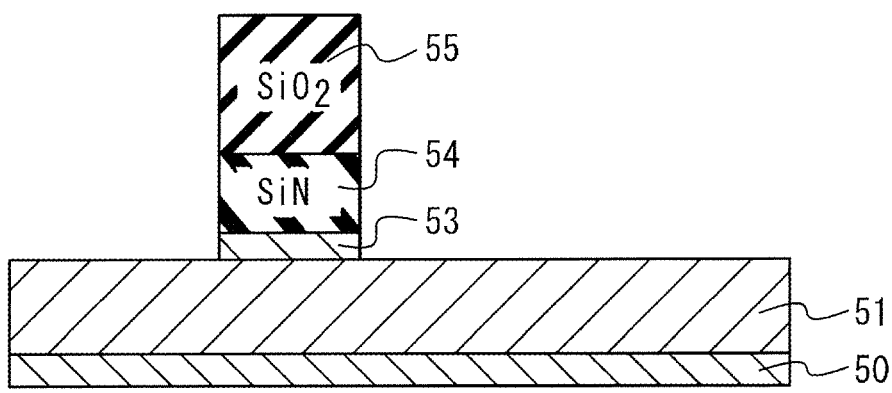
FIG. 15B is a cross sectional view for explaining the manufacturing process of the magnetic body device according to the embodiment.
Figure 15C:
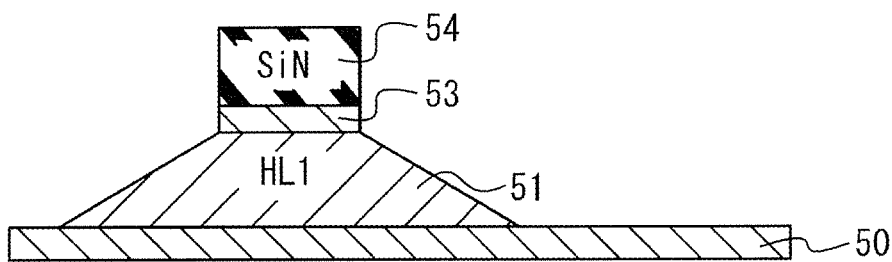
FIG. 15C is a cross sectional view for explaining the manufacturing process of the magnetic body device according to the embodiment.

Successively, as illustrated in FIG. 15C, the first magnetization hard layer 51 is patterned by etching using the hard mask.

Figure 15D:
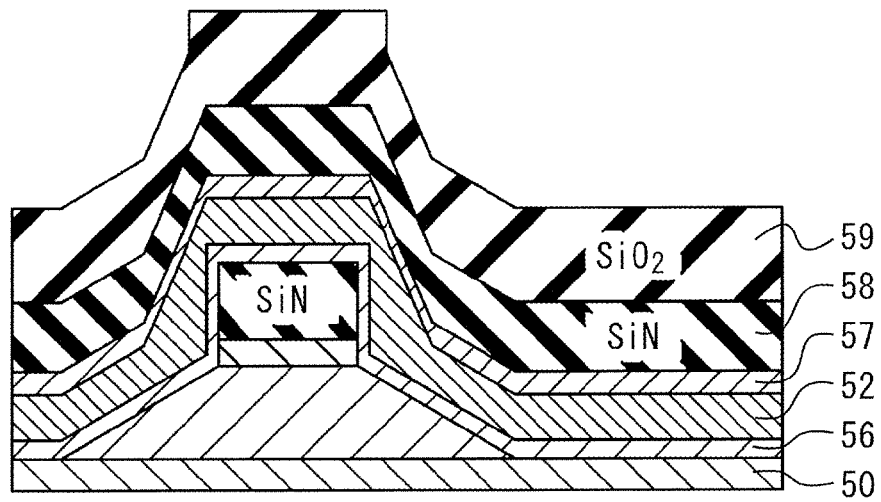
FIG. 15D is a cross sectional view for explaining the manufacturing process of the magnetic body device according to the embodiment.

Then, as illustrated in FIG. 15D, an underlying layer 56, a second magnetization hard layer 52, a cap layer 57, a hard mask layer (SiN) 58, and a hard mask layer ($SiO_2$) 59 are deposited successively.

Figure 15E:
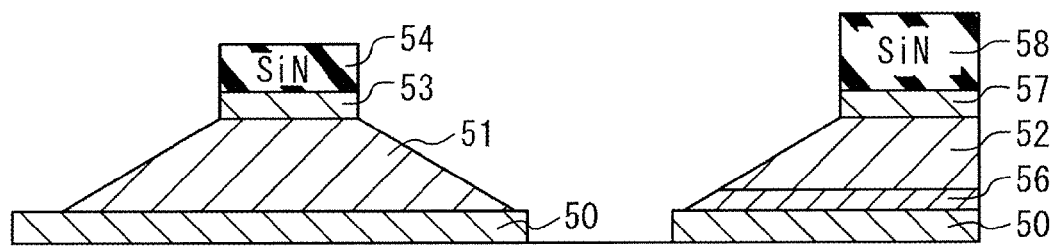
FIG. 15E is a cross sectional view for explaining the manufacturing process of the magnetic body device according to the embodiment.

Successively, a hard mask is formed in the same manner as in the case of FIG. 15B described above. Then, as illustrated in FIG. 15E, the second magnetization hard layer 52 is patterned by etching using the hard mask.

Figure 15F:
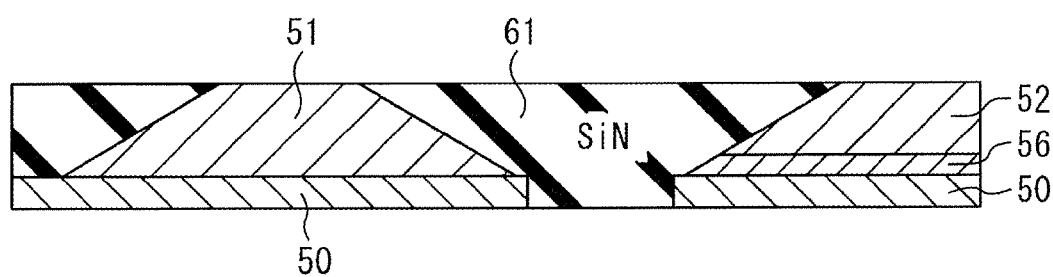
FIG. 15F is a cross sectional view for explaining the manufacturing process of the magnetic body device according to the embodiment.

Then, an interlayer insulating film (SiN) 61 is formed over the entire surface and then CMP (Chemical Mechanical Polishing) is performed. As a result, as illustrated in FIG. 15F, upper portions of the first magnetization hard layer 51 and the second magnetization hard layer 52 are exposed.

Figure 15G:
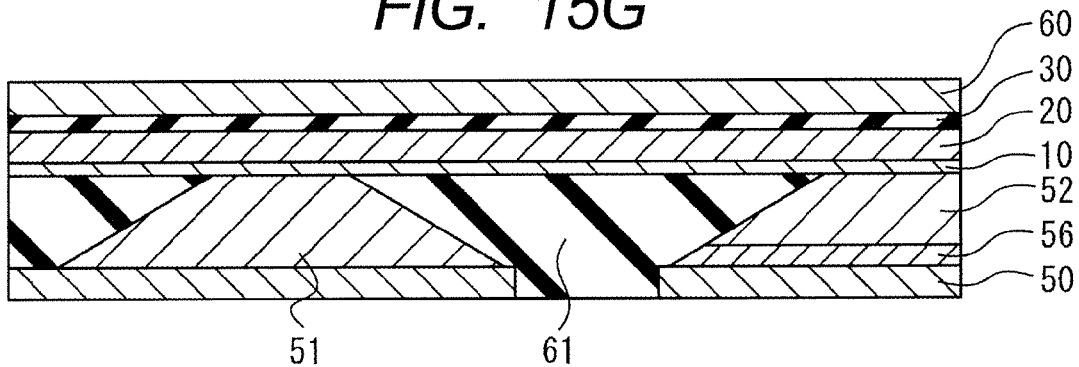
FIG. 15G is a cross sectional view for explaining the manufacturing process of the magnetic body device according to the embodiment.

Successively, as shown in FIG. 15G, an underlying layer 10, a magnetic body layer 20, a tunnel barrier layer (cap layer) 30, and a reference layer 60 are deposited successively.

In this case, the underlying layer 10 is in contact with the first magnetization hard layer 51 and the second magnetization hard layer 52. The first magnetization hard layer 51 and the second magnetization hard layer 52 are spaced apart in the in-plane direction (X-direction). Then, regions of the underlying layer 10 coupled to the first magnetization hard layer 51 and the second magnetization hard layer 52 respectively correspond to the first underlying region 11 and the second underlying layer 12.

The magnetic body layer 20 is a perpendicular magnetization film and formed over the underlying layer 10. The magnetic body layer 20 has a first region in contact with the first underlying region 11 (corresponding to the first characteristic change region 21), a second region in contact with the second underlying region 12 (corresponding to second characteristic change region 22), and a third region put between the first region and the second region (corresponding to free magnetization region 23).

A tunnel barrier layer 30 is formed over the magnetic body layer 20, the material for the tunnel barrier layer 30 is different from the material for the underlying layer 30.

The reference layer 60 is a perpendicular magnetization film and formed over the tunnel barrier layer 30.

Figure 15H:
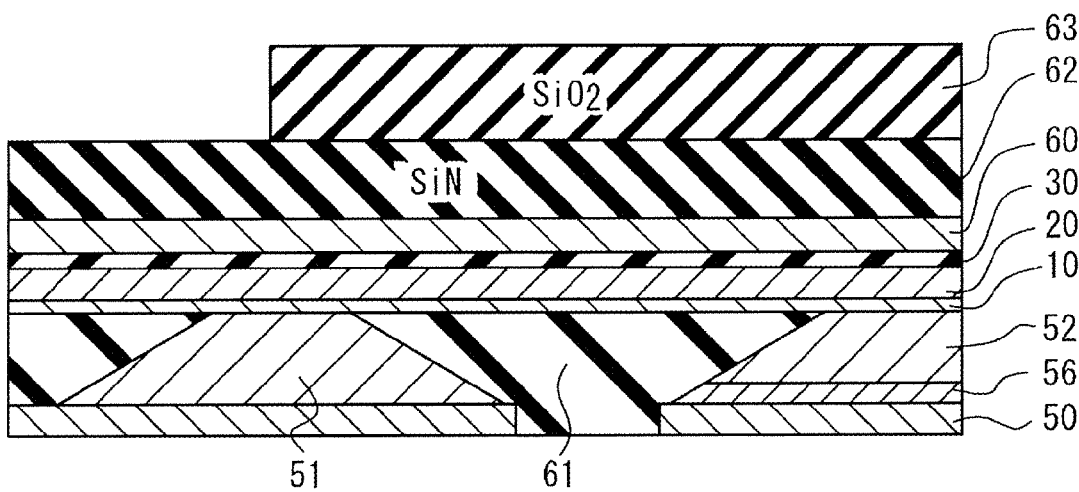
FIG. 15H is a cross sectional view for explaining the manufacturing process of the magnetic body device according to the embodiment.

Then, as illustrated in FIG. 15H, a hard mask layer (SiN) 62 and a hard mask layer ($SiO_2$) 63 are deposited successively over the reference layer 60. Further, the hard mask 63 is patterned by using a predetermined resist mask.

Figure 15I:
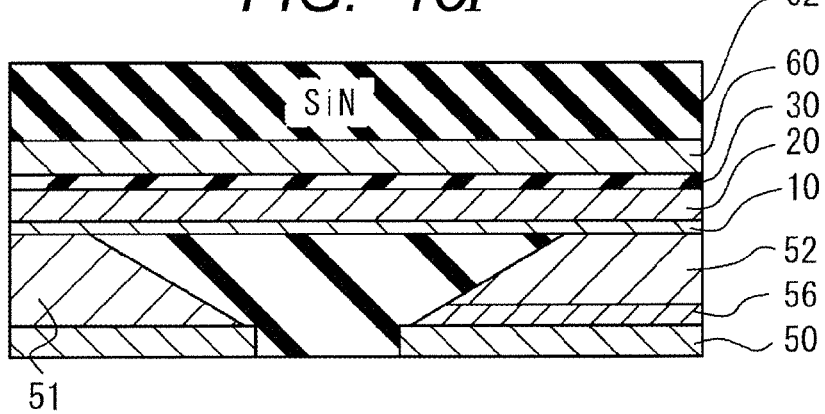
FIG. 15I is a cross sectional view for explaining the manufacturing process of the magnetic body device according to the embodiment.

Successively, a stacked structure at or below the hard mask layer 62 is patterned by using the hard mask layer 63 as a mask. As a result, a stacked structure as illustrated in FIG. 15I can be obtained.

Figure 15J:
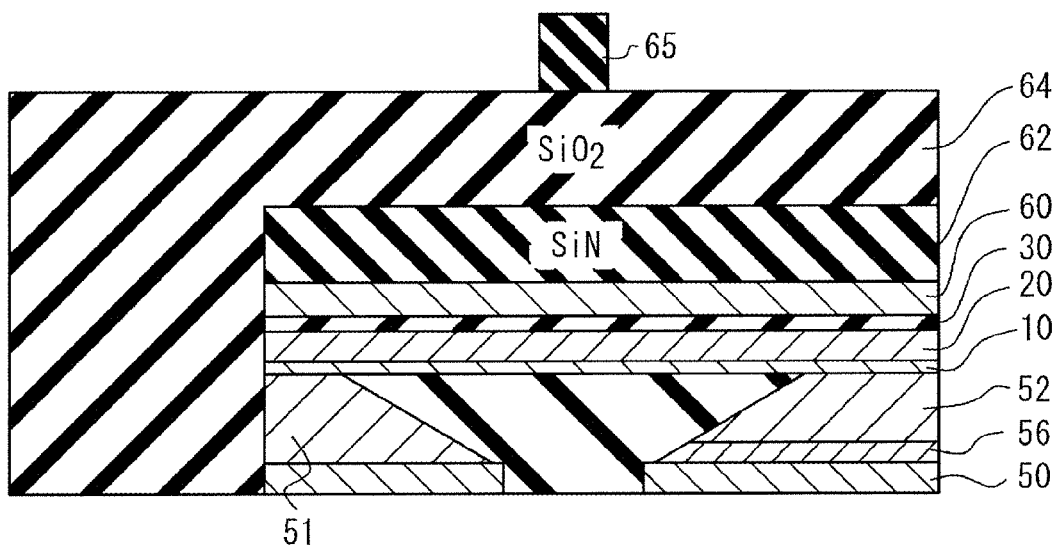
FIG. 15J is a cross sectional view for explaining the manufacturing process of the magnetic body device according to the embodiment.

Then, as illustrated in FIG. 15J, an interlayer insulating film 64 is formed over the entire surface. Further, a resist mask 65 having a predetermined pattern is formed over the interlayer insulating film 64 by photolithography. Specifically, the resist mask 65 having a predetermined pattern is formed so as to cover the third region used as the free magnetization region 23.

Figure 15K:
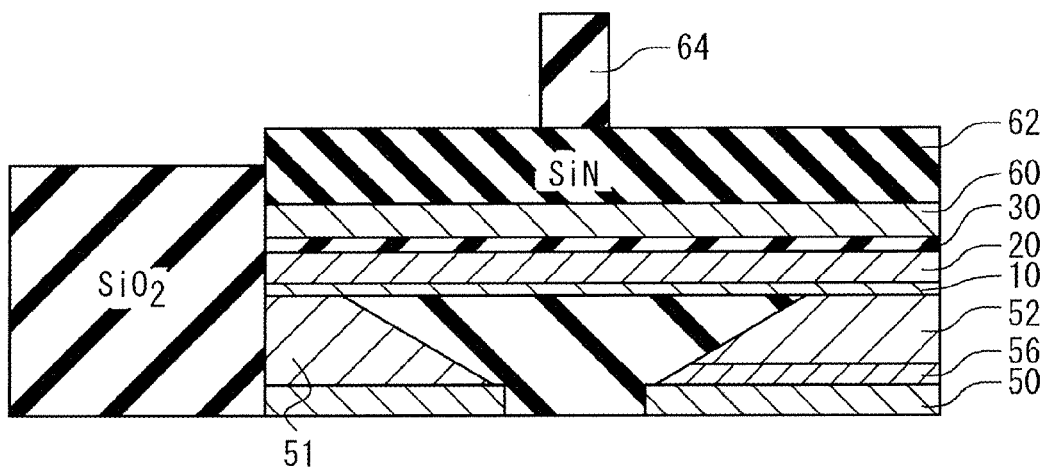
FIG. 15K is a cross sectional view for explaining the manufacturing process of the magnetic body device according to the embodiment.

Successively, the interlayer insulating film 64 is patterned by etching using the resist mask 65. As a result, as illustrated in FIG. 15K, a hard mask comprising a portion of the interlayer insulating film 64 is formed. Also the hard mask 64 covers a third region used as the free magnetization region 23.

Figure 15L:
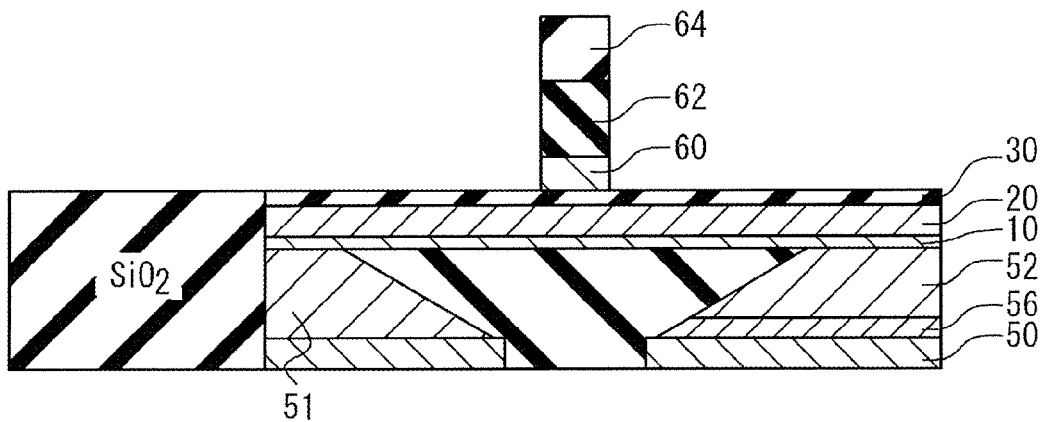
FIG. 15L is a cross sectional view for explaining the manufacturing process of the magnetic body device according to the embodiment.

Successively, as illustrated in FIG. 15L, the hard mask layer 62 and, further, the reference layer 60 are patterned by etching using the hard mask 64.

In this state, a region of the tunnel barrier layer 30 not covered by the hard mask 64 is exposed and subjected to etching. Characteristics of the region of the magnetic body layer 20 not covered by the hard mask 64 (first region, second region) can be changed by appropriately selecting etching conditions and an etching gas. Specifically, the perpendicular magnetic anisotropy of the region not covered by the hard mask 64 (first region, second region) becomes lower than the perpendicular magnetic anisotropy of the third region covered by the hard mask 64.

For example, a stacked structure of the underlying layer 10 (Ta)/magnetic body layer 20 (CoFeB)/tunnel barrier layer 30 (MgO)/reference layer 60 is considered. When the reference layer 60 is etched by using a gas containing an alcohol to the stacked structure, elimination of magnetization of the magnetic body layer 20 (CoFeB) was confirmed. It is considered that the perpendicular magnetic anisotropy of CoFeB is caused by the MgO interface and that MgO in the region subjected to etching is denatured. Further, magnetization of the region can be in an in-plane magnetization by appropriately performing ion implantation.

As described above, the first region and the second region not covered by the hard mask 64 in which the perpendicular magnetic anisotropy is lower provide the first characteristic change region 21 and the second characteristic change region 22. On the other hand, the third region which was covered by the hard mask 64 provides a free magnetization region 23. The free magnetization region 23 is put between the first characteristic change region 21 and the second characteristic change region 22. Further, the first characteristic change region 21 and the second characteristic change region 22 on both sides of the free magnetization region 23 are respectively in contact with the first underlying region 11 and the second underlying region 12. The reference layer 60 is formed over the tunnel barrier layer 30 at a position opposing to the free magnetization region 23. That is, the reference layer 60 is coupled by way of the tunnel barrier layer 30 to the free magnetization region 23.

As described above, while the invention made by the present inventors have been described specifically with reference to preferred embodiments, it will be apparent that the present invention is not restricted to the embodiments described above but can be modified variously within a range not departing the gist thereof.

What is claimed is:

1. A magnetic body device comprising:
   an underlying layer;
   a cap layer formed of a material different from that of the underlying layer;
   a magnetic body layer in contact at the lower surface with the underlying layer and in contact at the upper surface with the cap layer; and
   a pair of current terminals for supplying a current to the underlying layer and the magnetic body layer, wherein
   the magnetic body layer has
   a free magnetization region having a perpendicular magnetic anisotropy and
   a first characteristic change region and a second characteristic change region situated on both sides of the free magnetization region in a first in-plane direction,
   perpendicular magnetic anisotropy of the first characteristic change region and the second characteristic change region is lower than that of the free magnetization region,
   an external magnetic field containing a component in the first-plane direction is applied to the free magnetization region,
   the underlying layer has
   a first underlying region in contact with the lower surface of the first characteristic change region and
   a second underlying region in contact with the lower surface of the second characteristic change region, and
   the pair of current terminals is coupled to the first underlying region and the second underlying region respectively.

2. The magnetic body device according to claim 1, further comprising:
   a reference layer having a perpendicular magnetic anisotropy with the magnetization direction being pinned, wherein
   the cap layer is a tunnel barrier layer, and
   the reference layer is coupled by way of the tunnel burrier layer to the free magnetization region.

3. The magnetic body device according to claim 1, wherein each of the first characteristic change region and the second characteristic change region has magnetization containing a component in the first in-plane direction, and
   the external magnetic field applied to the free magnetization region is produced by the first characteristic change region and the second characteristic change region.

4. The magnetic body device according to claim 1, further comprising:
   a first magnetization hard layer provided below the first underlying region and having a first pinned magnetization; and
   a second magnetization hard layer provided below the second underlying region and having a second pinned magnetization, wherein
   the respective directions of the first pinned magnetization and the second pinned magnetization are defined such that the external magnetic field applied to the free magnetization region is produced by the first pinned magnetization and the second pinned magnetization.

5. The magnetic body device according to claim 4, wherein both of the first pinned magnetization and the second pinned magnetization contain a component in the first in-plane direction.

6. The magnetic body device according to claim 4, wherein the first pinned magnetization contains a component in a first perpendicular direction, and
   the second pinned magnetization contains a component in a second perpendicular direction opposing the first perpendicular direction.

7. The magnetic body device according to claim 4, wherein the first characteristic change region and the second characteristic change region have no magnetization.

8. The magnetic body device according to claim 1, wherein the thickness of the underlying layer is less than the thickness of the magnetic body layer.

9. A method of manufacturing a magnetic body device comprising:
   (A) forming an underlying layer coupled to a pair of current terminals in which the pair of current terminals are spaced apart in a first in-plane direction and coupled to a first underlying region and a second underlying region of the underlying layer respectively, (B) forming a magnetic body layer having perpendicular magnetic anisotropy over the underlying layer in which the magnetic body layer has
- a first region in contact with the first underlying region,
- a second region in contact with the second underlying region, and
- a third region put between the first region and the second region, (C) forming a cap layer over the magnetic body, in which the material for the cap layer is different from the material for the underlying layer, and (D) making the perpendicular magnetic anisotropy of the first region and the second region to a level lower than that of the third region.

10. The method of manufacturing the magnetic body device according to claim 9, further comprising:
- forming a perpendicular magnetization film over the cap layer, and
- etching the perpendicular magnetization film by using a mask covering the third region, thereby forming a reference layer coupled by way of the cap layer to the third region.

11. The method of manufacturing the magnetic body device according to claim 10, wherein
- a region of the cap layer not covered by the mask is subjected to the etching, thereby making the perpendicular magnetic anisotropy of the first region and the second region to a level lower than that of the third region.

12. The method of manufacturing the magnetic body device according to claim 10, wherein
- a gas containing an alcohol is used in the etching.

* * * * *